United States Patent [19]
O'Donnell et al.

[11] Patent Number: 5,414,426
[45] Date of Patent: May 9, 1995

[54] FAVORITE KEY MACRO COMMAND AND CHAINED MACRO COMMAND IN A REMOTE CONTROL

[75] Inventors: Frank A. O'Donnell, Clearwater, Fla.; Qiuju Luo, Orange; Kimthoa T. Nguyen, Yorba Linda, both of Calif.

[73] Assignee: Universal Electronics Inc., Twinsburg, Ohio

[21] Appl. No.: 990,862

[22] Filed: Dec. 11, 1992

Related U.S. Application Data

[63] Continuation-in-part of Ser. No. 586,957, Sep. 24, 1990, abandoned, which is a continuation of Ser. No. 127,999, Dec. 2, 1987, Pat. No. 4,959,810, which is a continuation-in-part of Ser. No. 109,336, Oct. 14, 1987, abandoned.

[51] Int. Cl.⁶ .............................. H04L 17/02
[52] U.S. Cl. ......................... 341/176; 348/734; 340/825.57; 359/146
[58] Field of Search ............. 341/176; 358/194.1; 455/151.1–151.4, 352; 340/825.57, 825.69, 825.72; 359/142–148; 348/734

[56] References Cited

U.S. PATENT DOCUMENTS

| | | | |
|---|---|---|---|
| 4,623,887 | 11/1986 | Welles, II | 340/825.57 |
| 4,626,848 | 12/1986 | Ehlers | 340/825.69 |
| 4,774,511 | 9/1988 | Rumbolt et al. | 340/825.69 |
| 4,779,079 | 10/1988 | Hauck | 345/168 |
| 4,935,870 | 6/1990 | Burk, Jr. et al. | 364/200 |
| 4,959,810 | 9/1990 | Darbee et al. | 364/900 |
| 5,005,118 | 4/1991 | Lenoski | 364/200 |
| 5,032,983 | 7/1991 | Fu et al. | 364/200 |
| 5,187,469 | 2/1993 | Evans et al. | 340/825.22 |

FOREIGN PATENT DOCUMENTS

| | | |
|---|---|---|
| 0309878 | 4/1989 | European Pat. Off. . |
| 0354313 | 2/1990 | European Pat. Off. . |
| 446864 | 9/1991 | European Pat. Off. ............ 341/176 |
| 2215928 | 9/1989 | United Kingdom . |
| 2229022 | 9/1990 | United Kingdom . |
| 2254468 | 10/1992 | United Kingdom . |
| 9222047 | 12/1992 | WIPO . |

OTHER PUBLICATIONS

IBM Technical Bulletin, "Remote Key Input to Personal Computer", Feb. 1987, vol. 29, No. 9.

Primary Examiner—John K. Peng
Assistant Examiner—Thomas J. Mullen, Jr.
Attorney, Agent, or Firm—Thomas R. Vigil

[57] ABSTRACT

The remote control comprises: a microprocessor including a CPU and a memory; a keyboard including a set of keys including one or more MACRO keys coupled to the microprocessor; lamp driver circuitry coupled to the microprocessor; circuitry for generating IR signals coupled to the IR lamp driver circuitry; code data for executing command functions which can be sent to a controlled device for causing the controlled device to perform specific functions stored in the memory; an entry/definition program in the memory for enabling a user of the remote control to define a macro for selecting at least one favorite channel by entry of series of keystroke commands on the keyboard; and a playback program in the memory for enabling an operator of the remote control to effect rapid selection of at least one favorite channel upon subsequent depression of the MACRO key.

13 Claims, 7 Drawing Sheets

FAVORITE KEY MACRO COMMAND AND CHAINED MACRO COMMAND IN A REMOTE CONTROL

CROSS-REFERENCE TO RELATED APPLICATIONS

This application is a Continuation-in-Part of U.S. patent application Ser. No. 07/586,957, filed Sept. 24, 1990, now abandoned, which is a Continuation of U.S. patent application Ser. No. 127,999, filed Dec. 2, 1987 which issued to U.S. Pat. No. 4,959,810 on Sep. 25, 1990, which is a Continuation-in-Part of U.S. patent application Ser. No. 109,336, filed Oct. 14, 1987, abandoned.

BACKGROUND OF THE INVENTION

1. Field of the Invention.

The present invention relates to a remote control of the type which is hand held and which can be coupled via coded infrared signals with a remote control receiver built into a television or other remotely controlled electrical apparatus to turn on the apparatus, such as the television, at a distance, to adjust the volume, tone and brightness, to change channels, to turn the television off and to perform other functions, and more specifically to a universal remote control wherein functions can be pre-programmed onto specific keys or pushbuttons for the convenience of the user.

2. Description of the related art including information disclosed under 37 CFR §§ 1.97–1.99

Heretofore it has been proposed to provide a reconfigurable remote control device and programmable functions for such a remote control device which will enable one to learn, store and retransmit infrared codes that are emitted from the remote control device for a remotely controlled apparatus, such as a television.

For example, in the Welles II U.S. Pat. No. 4,623,887 and the Ehlers U.S. Pat. No. 4,626,848, there is disclosed a reconfigurable remote control device which has the ability to learn, store and repeat remote control codes from any other infrared transmitter. Such a reconfigurable remote control transmitter device includes an infrared receiver, a microprocessor, a non-volatile random access memory (RAM), a scratch pad random access memory, and an infrared transmitter.

According to the teachings of the Ehlers patent, the infrared signals received by the remote control device are in bursts of pulses and the device counts the number of pulses in each burst as well as the time duration of each pause in a transmission between bursts.

The Darbee et al U.S. Pat. No. 4,959,810, of which this application is a Continuation-in-Part, discloses a universal remote control device having terminals for enabling code data to be supplied from outside the device through the terminals and a CPU to a RAM or ROM in the device.

As will be described in greater detail hereinafter, the remote control of the present invention is constructed, arranged and programmed to enable a user of the remote control to assign to one key on a keypad of the device a macro program for effecting a desired sequence of functions with one key stroke of that key and/or for enabling the user to rotate functions on successive depressions of that key, such as, for example, cycling through several different channels.

SUMMARY OF THE INVENTION

According to the present invention there is provided a remote control comprising: a microprocessor including a CPU and a memory; a keyboard coupled to the microprocessor and including a set of keys including at least one MACRO key; IR lamp driver circuitry coupled to the microprocessor; light emitting circuitry for generating and emitting IR signals coupled to the IR lamp driver circuitry; code data stored in the memory for creating the IR signals, which are sent by the light emitting circuitry to a controlled device to cause the controlled device to perform specific command functions; a macro entry/definition program in the memory for enabling a user of the remote control to define a macro for selecting at least one favorite channel by entry of a series of keystroke commands on the keyboard; and, a macro playback program in the memory for enabling an operator of the remote control to effect rapid selection of at least one favorite channel upon subsequent depression of the at least one MACRO key.

Also according to the present invention there is provided a remote control comprising: a microprocessor including a CPU and a memory; a keyboard coupled to the microprocessor and including a set of keys including number keys and at least one MACRO key; IR lamp driver circuitry coupled to the microprocessor; light emitting circuitry for generating and emitting IR signals coupled to the IR lamp driver circuitry; code data for creating the IR signals, which are sent by the light emitting circuitry to a controlled device to cause the controlled device to perform specific command functions, stored in the memory; a macro entry/definition program stored in the memory; circuitry for entering a predetermined keystroke sequence on the keyboard; circuitry and program instructions for determining if the predetermined keystroke sequence is, according to the macro entry/definition program, a command to establish a select channel macro; circuitry and program instructions for determining, after a select channel macro command is sensed, if a number key or keys have been depressed followed by depression of the at least one MACRO key; and, circuitry and program instructions for storing the number(s) of the depressed number key or keys in association with the at least one MACRO key in the memory.

Further according to the present invention there is provided a method for entering a channel select macro by depressing at least one MACRO key on a keypad in a remote control, the remote control including: a microprocessor including a CPU and a memory; a keyboard coupled to the microprocessor and including the keypad which comprises a set of keys including number keys and at least one MACRO key; IR lamp driver circuitry coupled to the microprocessor; light emitting circuitry for generating IR signals coupled to the IR lamp driver circuitry; code data for creating the IR signals, which are sent by the light emitting means to a controlled device to cause the controlled device to perform specific command functions, stored in the memory; and, a macro entry/definition program stored in the memory, the method comprising the steps of: entering a predetermined keystroke sequence on the keypad; determining if the predetermined keystroke sequence is, according to the macro entry/definition program, a command to establish a select channel macro; and, if so, determining if, subsequently, a number key or keys have been depressed followed by depression of the at least one MACRO key; and, storing the number(s) of the depressed number key or keys in association with the at least one MACRO key in the memory.

DESCRIPTION OF THE PREFERRED EMBODIMENT(S)

Figure 1:
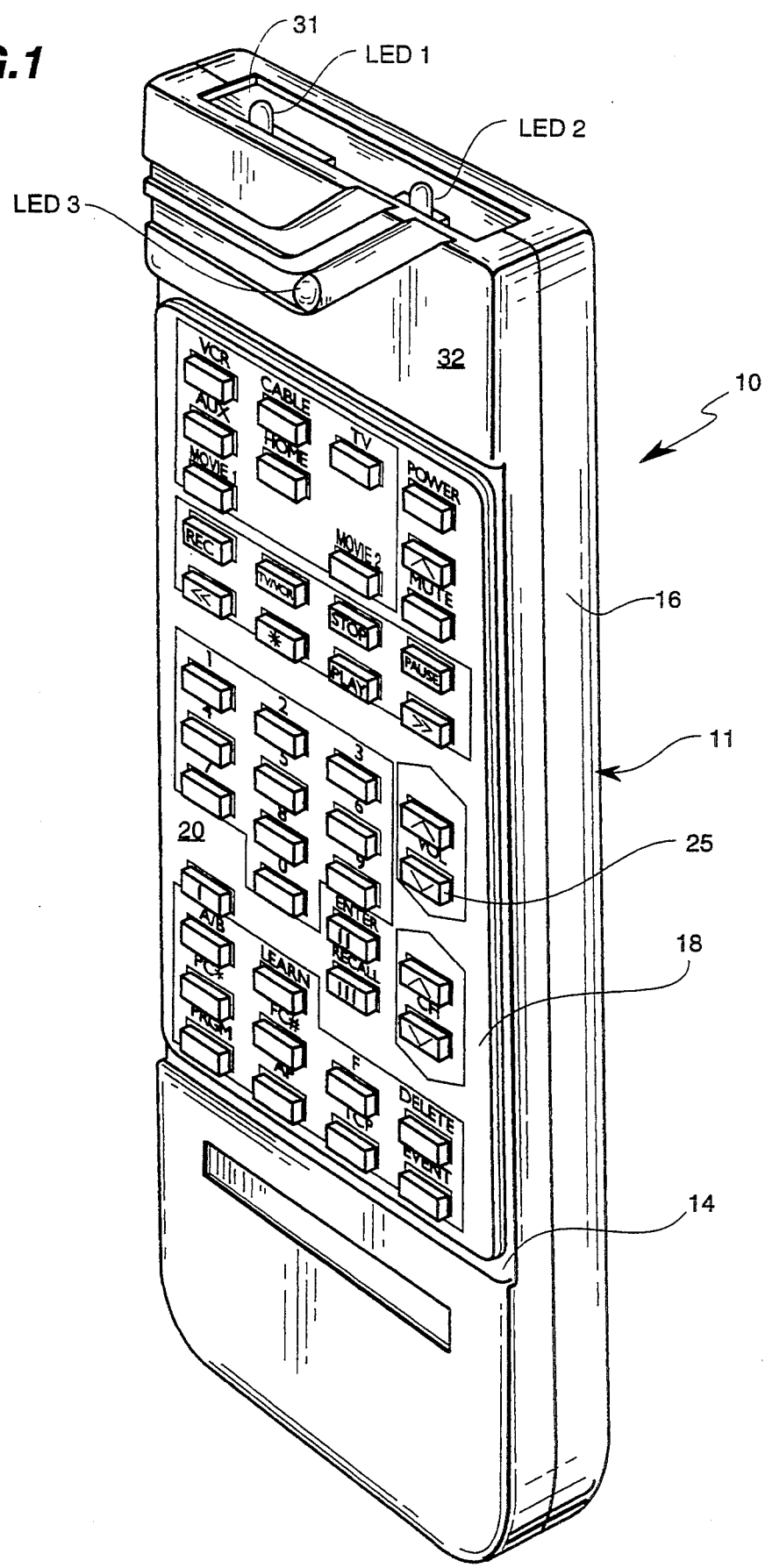
FIG. 1 is a front perspective view of a remote control constructed according to the teachings of the present invention.

Referring now to FIG. 1 in greater detail, there is illustrated therein a remote control 10 constructed according to the teachings of the present invention.

As shown, the remote control 10 includes a housing 11 including an upper housing member 12 having a base panel 14, and a lower housing member 16. An overlay face panel 18 is positioned over the base panel 14 and has a keyboard layout, i.e. keypad 20, on the outer surface thereof.

The two panels 14 and 18 have openings therethrough for receiving elastomeric pushbuttons 25, for the keypad 20, all of which extend from and are fixed to or integral with an elastomeric body panel.

The pushbuttons 25 are arranged in rows and columns and are identified as follows on the keypad 20:

| VCR | CABLE | TV | POWER |
|---|---|---|---|
| AUX | HOME | | |
| MOVIE 1 | | MOVIE 2 | MUTE |
| REC | TV/VCR | STOP | PAUSE |
| << | * | PLAY | >> |
| 1 | 2 | 3 | |
| | | | VOL |
| 4 | 5 | 6 | |
| 7 | 8 | 9 | |
| | | 0 | ENTER |
| | | | CH |
| 1 | | RECALL | |
| A/B | LEARN | | |
| PC* | FC# | F | DELETE |
| PRGM | AP | TCP | EVENT |

Figure 2:
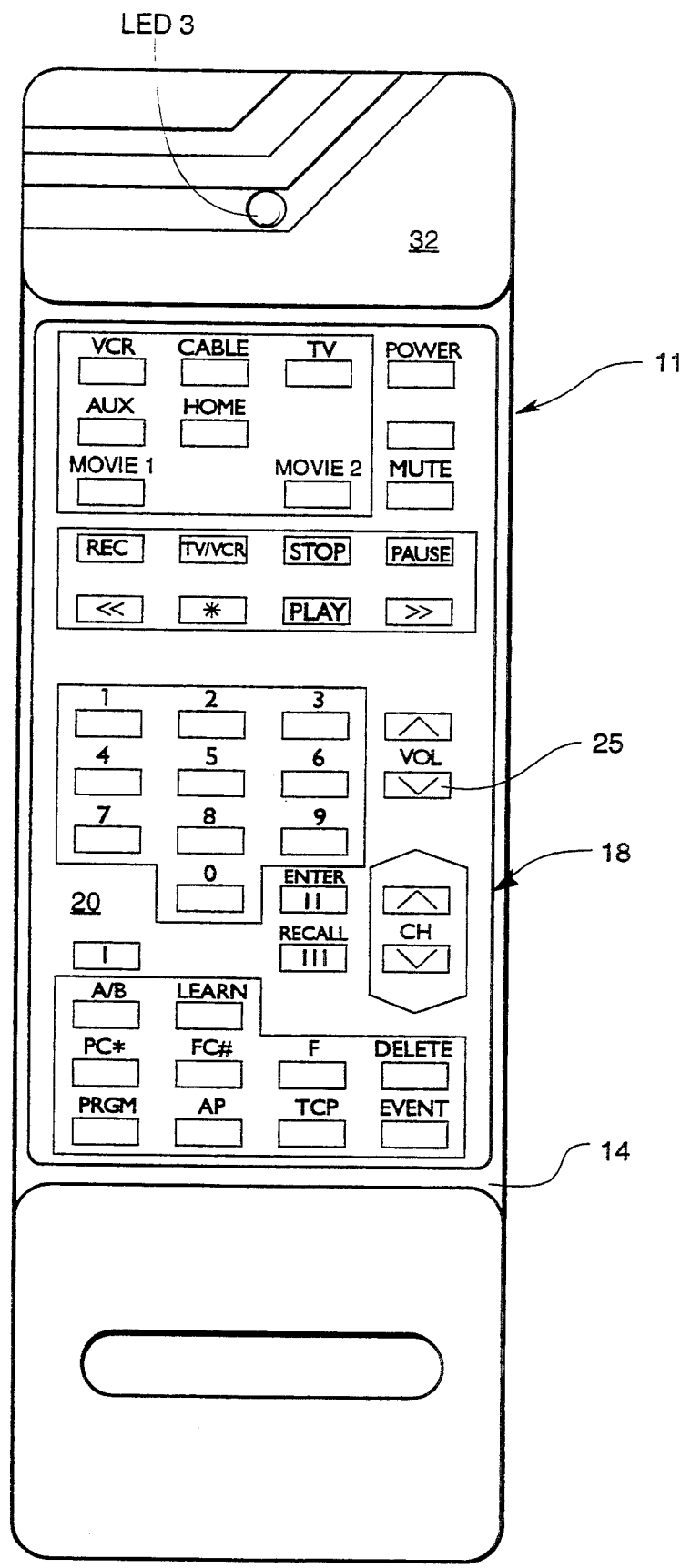
FIG. 2 is a front plan view of the remote control 10 shown in FIG. 1 and shows the various keys or push buttons of the remote control.

This arrangement is shown in FIG. 2, and the manner in which some of these pushbuttons 25 are utilized in operating the remote control 10 will be described in greater detail hereinafter.

At a top or forward end 28 of the remote control 10 there is provided an opening 30 for two light emitting diodes LED 1 and LED 2. The opening 30 is covered by an infrared-transparent lens 31. Also provided on a top surface 32 of the upper housing member 12 of the remote control 10 is a light emitting diode, LED 3, by which information is communicated to the user of the remote control 10.

FIG. 2 is a plan view of the keyboard or keypad 20 and shows the different keys or pushbuttons 25 of the remote control 10 extending through the base panel 14 of upper housing member 12 and the face panel 18 where the label or identification for each pushbutton or key 25 is shown. The light emitting diode LED 4 is also indicated.

Figure 3:
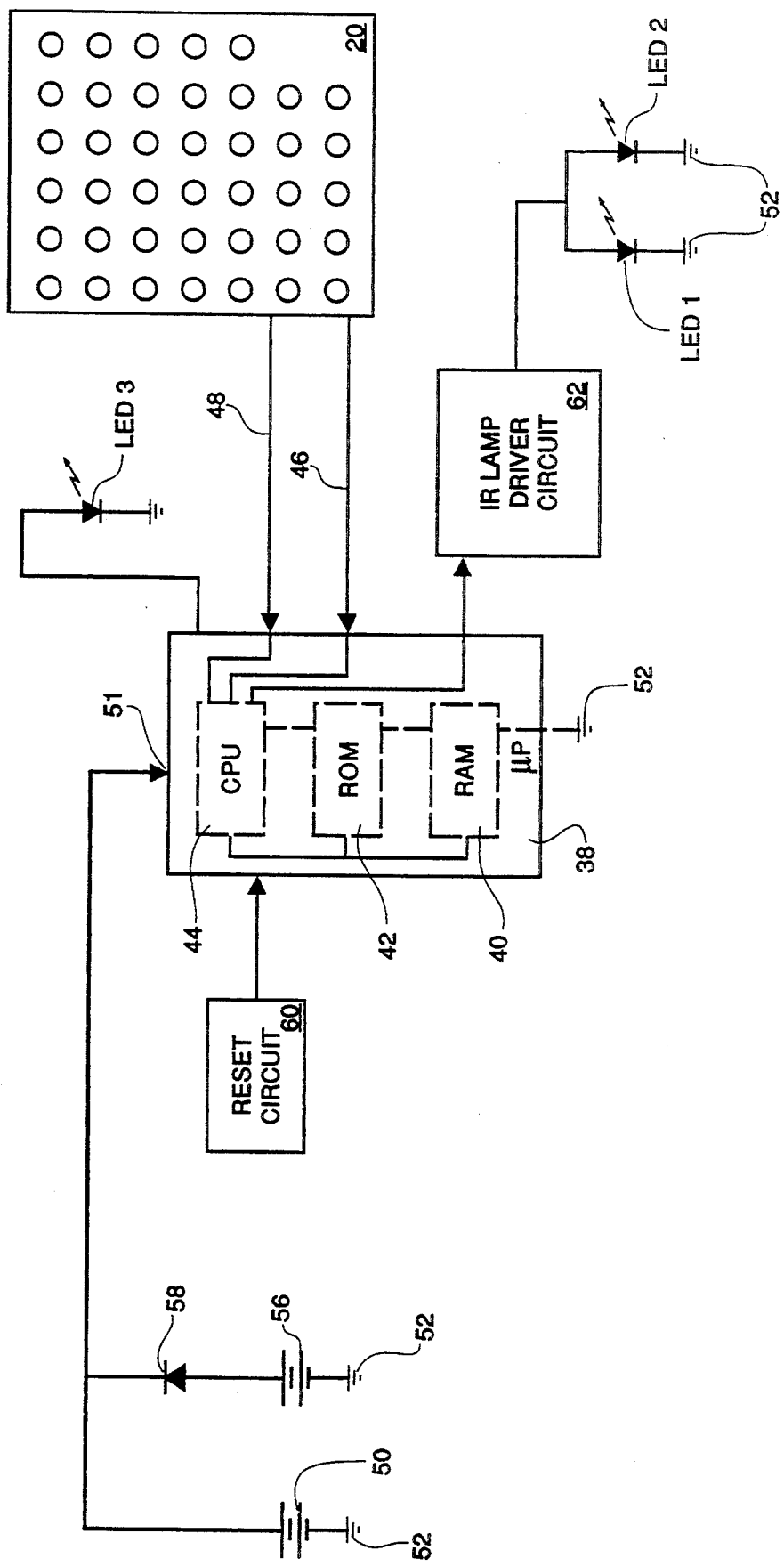
FIG. 3 is a block electrical schematic circuit diagram of the remote control shown in FIGS. 1 and 2.

FIG. 3 is a block electrical schematic circuit diagram of the operating circuitry 36 in the remote control 10 which includes a microprocessor 38, including a RAM 40, a ROM 42 and a CPU 44. The keypad 20 is coupled to the microprocessor 38 by an interrupt line 46 and a bus 48 to the CPU 44.

A power supply in the form of a battery 50 is connected between a +voltage input 51 to the microprocessor 38 and a system ground 52. A backup battery 54 is connected through a diode 56 to the +voltage input 51 to maintain the data stored in the memory 42 and/or 44 to provide a non-volatile system.

A reset circuit 58 is coupled to the microprocessor 38, as shown.

An output of the CPU 44 is connected to an IR lamp driver circuit 62 which outputs a voltage to the two light emitting diodes LED 1 and LED 2.

The status indicating LED 3 is also connected to an input of the CPU 44.

The electrical circuitry 36 is generally of the type disclosed in greater detail in the Darbee et al U.S. Pat. No. 4,959,810, the disclosure of which is incorporated herein by reference, and can be a modified circuit, e.g., it can be for a dedicated remote, as opposed to a universal remote control.

The operating programs for the remote control 10 which is stored in the ROM 42 or RAM 40 are similar to the operating programs disclosed in the Darbee et al U.S. Pat. No. 4,959,810, incorporated herein by reference, with the exception of parts of the favorite channel macro program and of the rotating macro program for selecting a sequence of three pre-selected channels.

Figure 4:
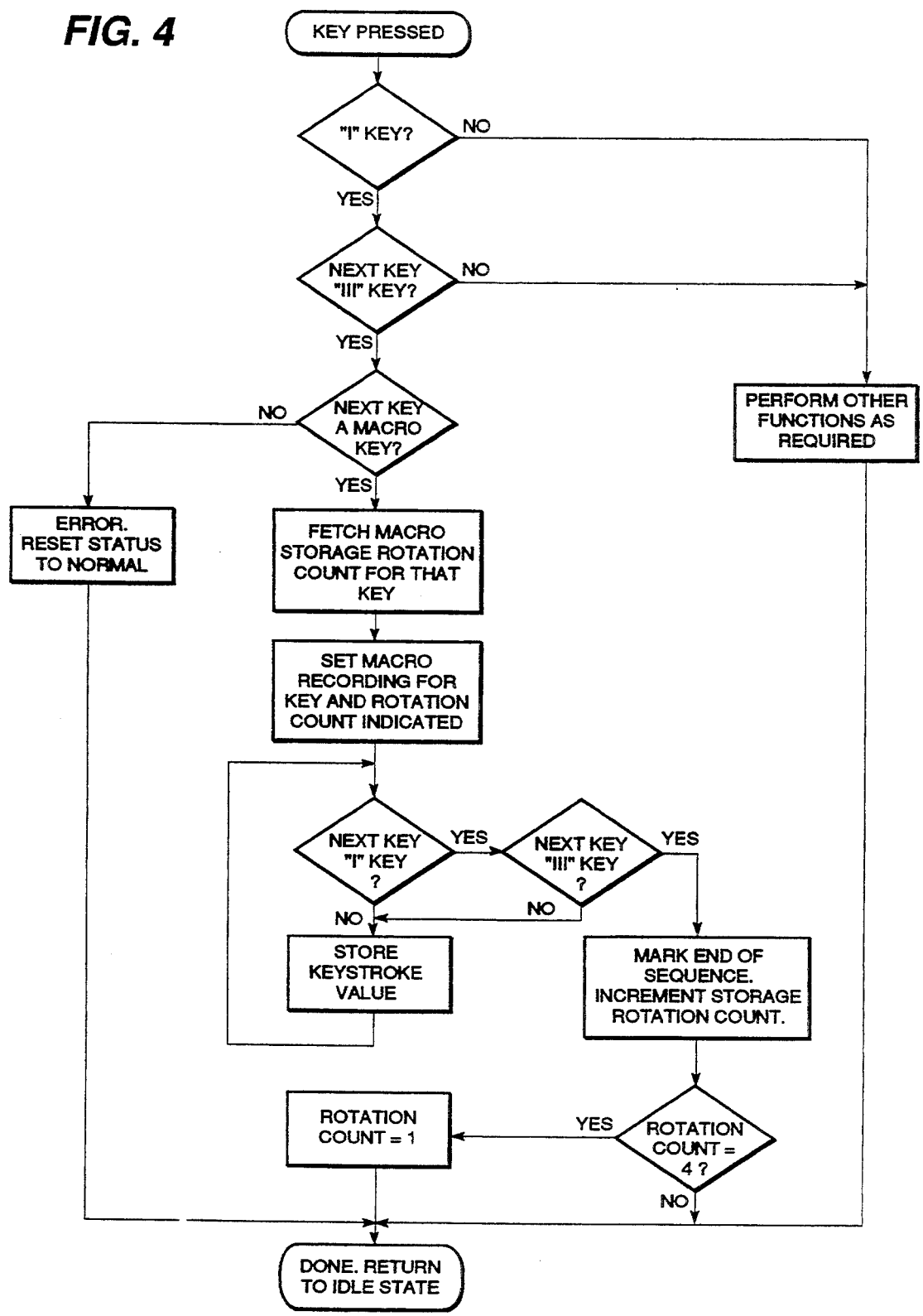
FIG. 4 is a flow chart of the steps performed by a macro entry definition program stored in the remote control and entitled: ROTATING MACROS: entry and definition.
Figure 5:
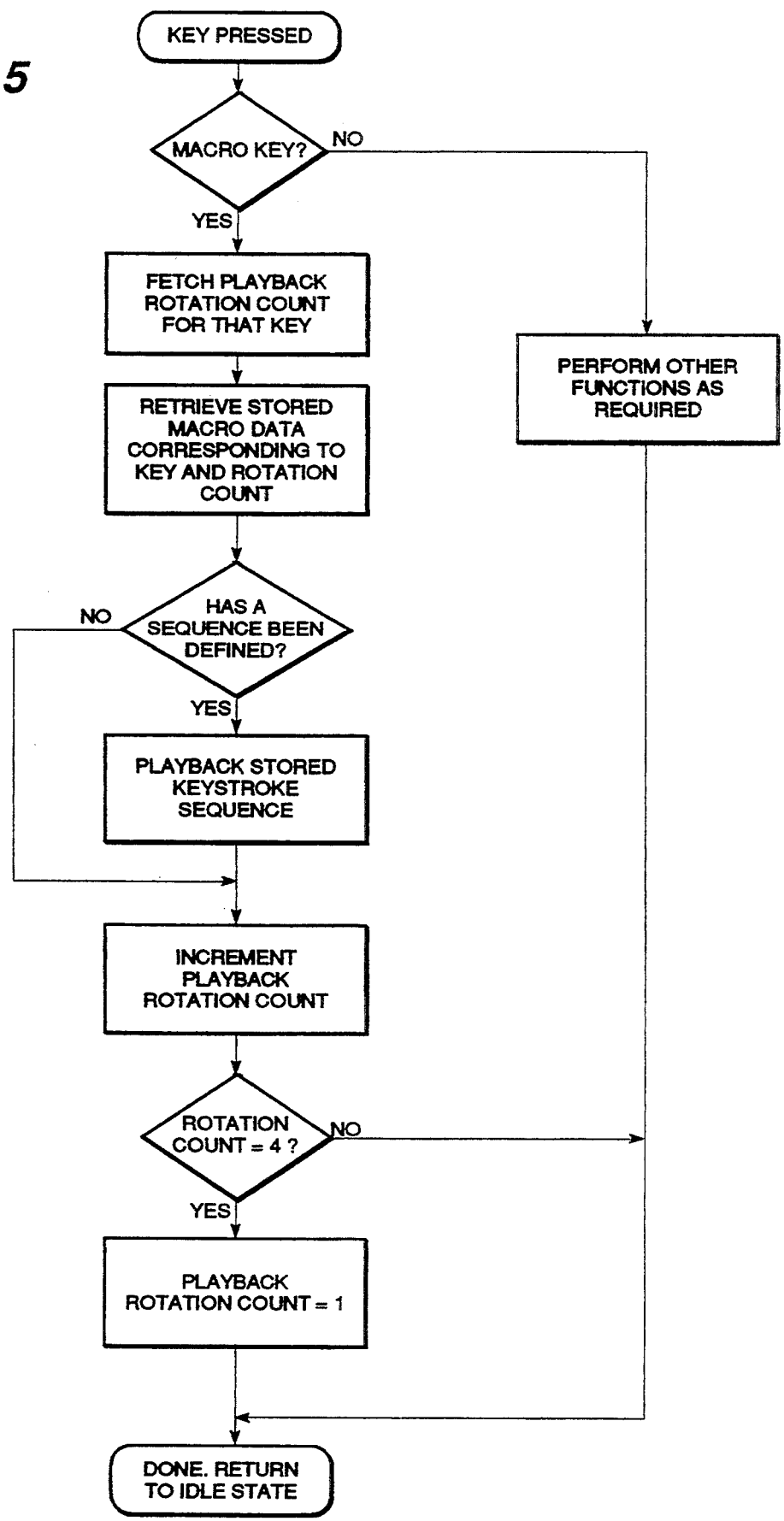
FIG. 5 is a flow chart of the steps performed by a macro playback program stored in the remote control and entitled: MACRO: playback.

With reference to FIGS. 4 and 5, the remote control 10 of the present invention has stored in the memory thereof (RAM or ROM) a program for enabling one to press one key or button to establish a rotating macro program whereby the first keystroke on a selected key will cause the remote control 10 to emit IR command function signals to a controlled device, such as the television, to set the television to one pre-selected channel. A second depression of the selected key will cause the remote control to emit IR command function signals to cause the television to move to a second preselected channel. Then, a third key stroke of the selected key will cause the remote control 10 to emit IR command function signals to cause the television to move to a third pre-selected channel.

To establish the rotating macro, the keyboard 20 has special rotating MACRO keys. In the particular implementation of the remote control 10 shown in the drawings, these keys are labelled MOVIE 1 for "SHOWTIME", for example and MOVIE 2 for "HBO", for example. These MACRO keys can be colored a special color, e.g., red.

To define the macro one presses the I key (which also can be labeled and/or referred to as the "DO" key), then the RECALL (or III) key followed by the MACRO key to be defined. Then the operator presses a channel key or keys, e.g., such as 1 and 2 for channel 12 or can press the CABLE key and a desired cable channel, e.g. 32, finally pressing the DO (or I) key followed by the RECALL (or III) key.

The program then decrements a rotation counter and repeats the above-defined steps for another selected channel until one has entered three selected channels.

If one attempts to establish a fourth macro for a fourth selected channel, the first macro for the first selected channel will be erased and overwritten.

If only one selected macro is created, the second and third keystrokes of a MACRO key will cause nothing to happen and the fourth keystroke will repeat the selection of the first selected macro to select the single selected channel.

To erase the macro, one presses the DO (or I) key, the 0 key followed by the RECALL (or III) key.

As apparent from a study of FIG. 4, the program first determines whether a depressed key or keystroke is the "I" key. If not, the program performs other functions as required and exits to the idle state.

If yes, the program then determines if the next keystroke is the "III" key. If not, the program performs other functions as required and exits to an idle state.

Then the program determines if the third keystroke is a MACRO key.

If not, there is an error and the program resets to the idle state.

Next the program will fetch the macro number storage rotation, for that keystroke of that MACRO key.

Next the program sets the macro for recording the keystroke and rotation count indicated.

This is followed by a determination if the subsequent keystroke is a "I" keystroke. If not, the keystroke value for that channel is stored in memory.

Then when it is determined that a subsequent keystroke is the "I" key, a determination is made if the next subsequent keystroke is the "III" key. If no, the program cycles back. If yes, the program marks the end of the sequence and increments the storage rotation count.

Then if the rotation count equals 4, the program renumbers the rotation count to equal 1 and exits to the idle state. If the rotation count is less than 4, the program simply exits to the idle state.

Turning now to FIG. 5, there is illustrated therein the macro playback program. Here, a determination is made if a MACRO key has been struck. If not, the program performs other functions as required and exits to the idle state.

If yes, the program fetches the playback rotation count for that macro key. Then, the stored macro data corresponding to the key and rotation count is retrieved from memory.

Next a determination is made if a sequence has been defined. If yes, the stored stroke sequence is played back followed by incrementing of the playback rotation count.

If the answer was no, the program goes directly to the incremented playback rotation count.

Then a determination of the rotation count is made and, if the count is less than 4, the program exits to the idle state.

If the rotation count is 4, the rotation count playback is set equal to 1 and the program exits to the idle state.

A variation of the rotating macro program is a macro program, similar to the macro program illustrated in FIGS. 18A and 18B of U.S. Pat. No. 4,959,810 of which this application is a continuation-in part and the disclosure of which is incorporated herein by reference, for setting a MACRO key to cause the remote control 10 to select a favorite channel. For this purpose the remote control 10 is provided with a program for selecting a single, favorite channel.

Figure 6:
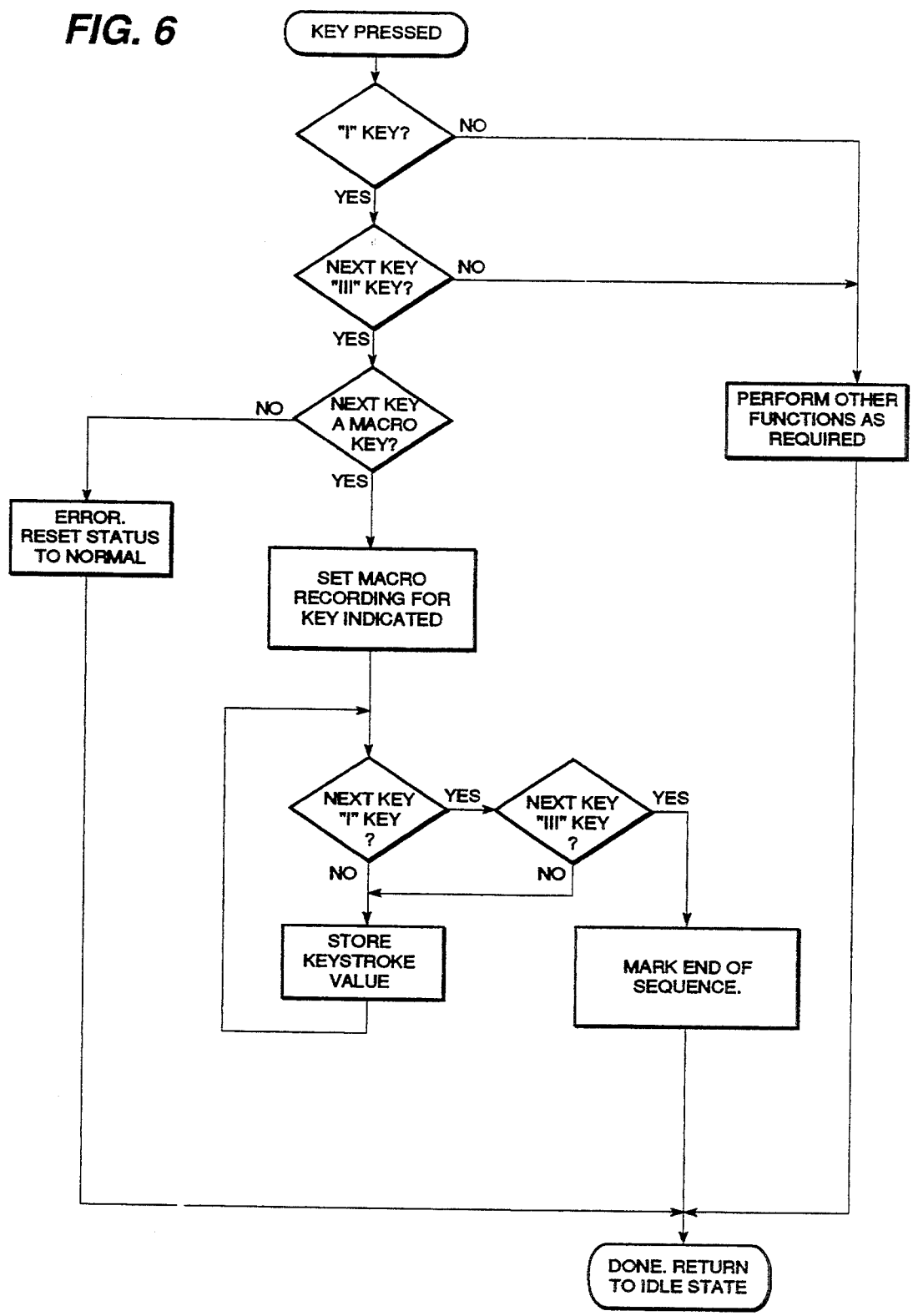
FIG. 6 is a flow chart of the steps performed by a single e.g., favorite channel, macro stored in the remote control and entitled: SELECTED CHANNEL MACRO: entry and definition.

The routine protocol or steps of the macro for establishing a selected channel key is shown in FIG. 6. An examination of FIG. 6 will readily show that this favorite channel macro is similar to the rotating macro.

In this respect, one first presses the I key followed by the RECALL (or III) key, a MACRO key and the channel number key or keys for the channel selected.

Figure 7:
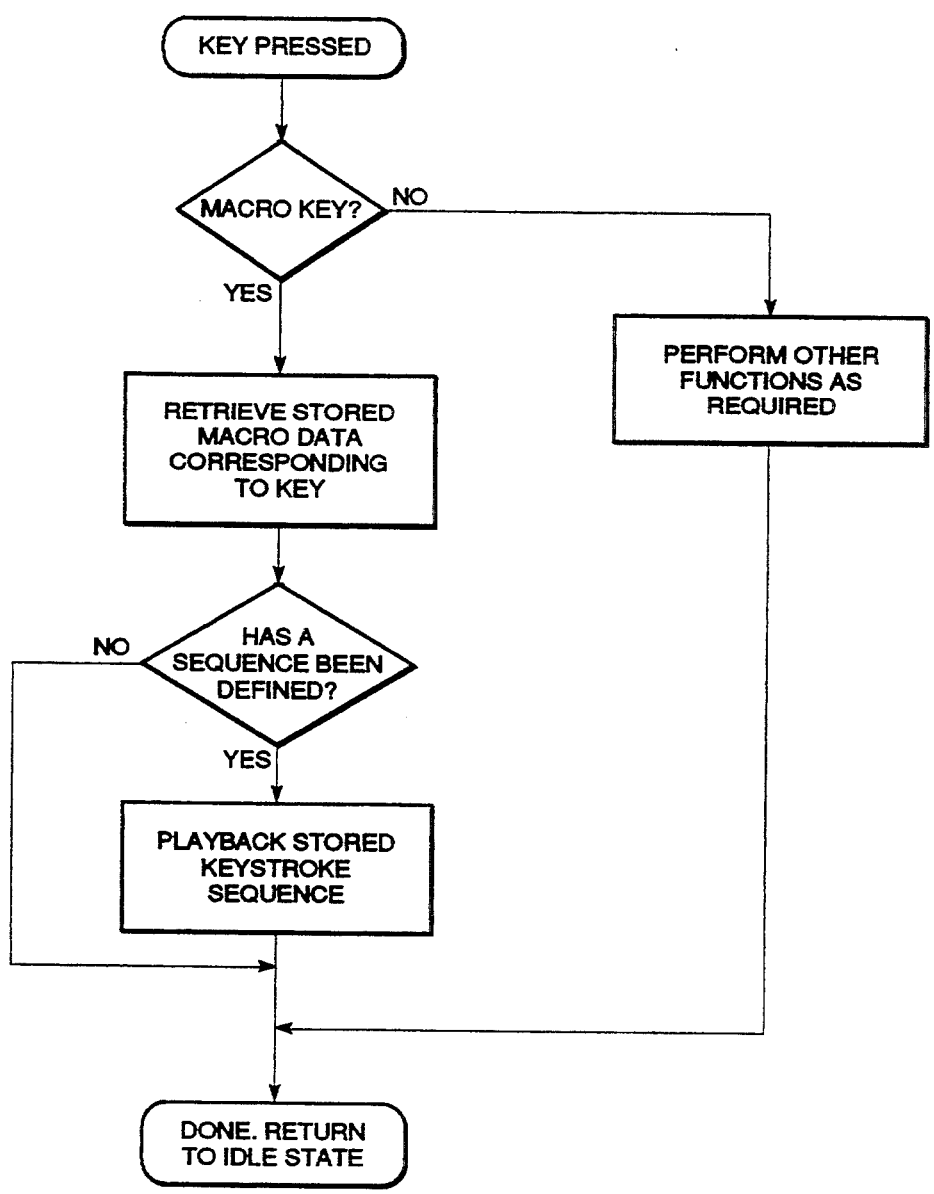
FIG. 7 is a flow chart of the steps performed by a single, e.g., favorite channel, macro stored in the remote control and entitled: SELECTED CHANNEL MACRO: playback.

Then, as shown in FIG. 7, to call up a favorite channel, one presses the MACRO key which will retrieve the stored macro data concerning the favorite channel corresponding to that MACRO key.

From the foregoing description, it will be apparent that the remote control 10 of the present invention and the method (or programs) for operating same to enter and define a rotating channel sequence macro or a favorite channel macro enables a user of the remote control to customize his remote control for his preference in viewing one to three favorite channels.

Moreover, it will be apparent from the foregoing description that modifications can be made to the remote control and method for operating same without departing from the teachings of the present invention.

Accordingly, the scope of the invention is only to be limited as necessitated by the accompanying claims.

We claim:

1. A remote control comprising:
   a microprocessor including a CPU and memory means;
   a keyboard coupled to said microprocessor and including a set of keys including at least one MACRO key;
   IR lamp driver circuitry coupled to said microprocessor;
   light emitting means for generating and emitting IR signals coupled to said IR lamp driver circuitry;
   code data stored in said memory means for creating the IR signals, which are sent by said light emitting means to a controlled device to cause the controlled device to perform specific command functions;
   a macro entry/definition program in said memory means for enabling a user of said remote control to define a macro for selecting at least one favorite channel by entry of a series of keystroke commands on said keyboard; and,
   a macro playback program in said memory means for enabling an operator of said remote control to effect rapid selection of at least one favorite channel upon subsequent depression of said at least one MACRO key.

2. The remote control of claim 1 wherein said macro entry/definition program includes means for establishing and recalling three selected channels upon depression of a predetermined series of keystrokes and the at least one MACRO key.

3. The remote control of claim 2 wherein said keyboard further includes specific keys designated to initiate macro definition and strokes of said specific keys define the predetermined series of keystrokes.

4. The remote control of claim 1 wherein said set of keys include number keys that are numbered in accordance with channel numbers.

5. A method for entering a channel select macro by depressing at least one MACRO key on a keypad in a remote control, said remote control including:
- a microprocessor including a CPU and memory means;
- a keyboard coupled to said microprocessor and including the keypad which comprises a set of keys including number keys and the at least one MACRO key;
- IR lamp driver circuitry coupled to the microprocessor;
- light emitting means for generating IR signals coupled to the IR lamp driver circuitry;
- code data stored in said memory means for creating the IR signals, which are sent by said light emitting means to a controlled device to cause the controlled device to perform specific command functions; and,
- a macro entry/definition program stored in said memory means, said method comprising the steps of:
- entering a predetermined keystroke sequence on the keypad;
- determining if the predetermined keystroke sequence is, according to the macro entry/definition program, a command to establish a select channel macro; and, if so,
- determining if, subsequently, a number key or keys have been depressed followed by depression of the at least one MACRO key; and,
- storing the number(s) of the depressed number key or keys in association with the at least one MACRO key in said memory means.

6. The method of claim 5 wherein the keyboard further includes a DO key and a RECALL key and said step of entering a predetermined keystroke sequence comprises the steps of depressing the DO key, the RECALL key and the at least one MACRO key.

7. The method of claim 4 further including the steps of:
- identifying and storing in the memory means, the end of the sequence of keystrokes entered which is followed by the first depression of the at least one MACRO key;
- determining if a rotation count of macro keystrokes equals four; and, if not,
- returning the remote control to an idle or ready state; and, if the rotation count equals 4,
- resetting the rotation count to equal one and then returning the remote control to said idle or ready state.

8. The method of claim 7 including the further step of repeating the steps of claim 4.

9. The method of claim 8 including the further step of repeating the steps of claim 6 and then the steps of claim 4.

10. A remote control comprising:
- a microprocessor including a CPU and memory means;
- a keyboard coupled to said microprocessor and including a set of keys including number keys and at least one MACRO key;
- IR lamp driver circuitry coupled to said microprocessor;
- light emitting means for generating and emitting IR signals coupled to said IR lamp driver circuitry;
- code data stored in said memory means for creating the IR signals, which are sent by said light emitting means to a controlled device to cause the controlled device to perform specific command functions;
- a macro entry/definition program stored in said memory means;
- means for determining if a predetermined keystroke sequence entered on the keyboard is, according to said macro entry/definition program, a command to establish a select channel macro;
- means for determining, after a select channel macro command is sensed, if one or more of said number keys have been depressed followed by depression of the at least one MACRO key; and,
- means for storing the number(s) of the depressed number key or keys in association with the at least one MACRO key in said memory means.

11. The remote control of claim 10 further including:
- means for identifying and storing in said memory means the end of the sequence of keystrokes entered which is followed by the first depression of the at least one MACRO key;
- means for determining if a rotation count of the at least one macro keystrokes equals four;
- means for returning said remote control to an idle or ready state when the rotation count is not equal to four; and,
- means for resetting the rotation count to equal one and then returning said remote control to said idle or ready state when the rotation count is equal to four.

12. The remote control of claim 10 wherein said keyboard further includes a DO key and a RECALL key and said predetermined keystroke sequence includes depressing the DO key, the RECALL key, and the at least one MACRO key.

13. The remote control of claim 10 wherein said number keys are numbered in accordance with channel numbers.

* * * * *

UNITED STATES PATENT AND TRADEMARK OFFICE
Certificate

Patent No. 5,414,426                                                                                                            Patented: May 9, 1995

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Frank A. O'Donnell, Clearwater, FL (US); Qiuju Luo, Orange, CA (US); Kimthoa T. Nguyen, Yorba Linda, CA (US); and Paul Darbee, Trabuco Canyon, CA (US).

Signed and Sealed this Third Day of September 2013.

<div style="text-align:right">

HAI PHAN
*Supervisory Patent Examiner*
Art Unit 2685
Technology Center 2600

</div>